Figure 1:
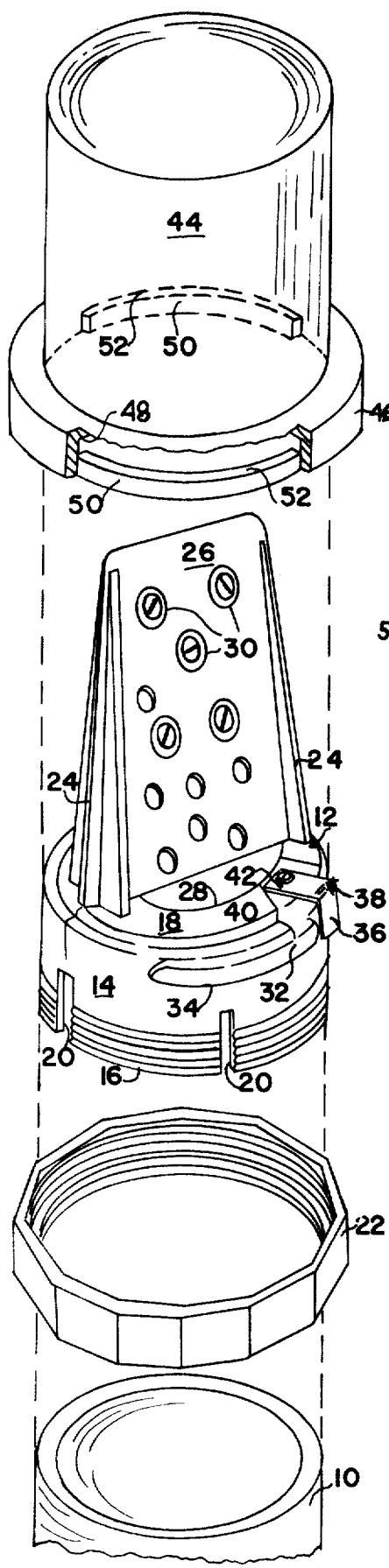

United States Patent [19]

Borin et al.

[11] 4,382,155

[45] May 3, 1983

[54] LOCK FOR A TEST STATION APPARATUS

[76] Inventors: Frank W. Borin, Bel Air; Jeffrey G. Thomas, Northridge, both of Calif.

[21] Appl. No.: 189,086

[22] Filed: Sep. 22, 1980

[51] Int. Cl.³ .......................... H02G 9/02; H02G 3/08; H05K 5/00

[52] U.S. Cl. ........................................ 174/38; 174/60; 285/87

[58] Field of Search ......... 339/DIG. 2, 198 R, 198 L, 339/13; 174/59, 60, 52 R, 50, 38; 285/82, 87, 91, 360, 326, 391, 401; 411/193, 194, 198, 202, 203

[56] References Cited

U.S. PATENT DOCUMENTS

| 873,892 | 12/1907 | Petterson | 285/87 |
| 875,004 | 12/1907 | Shears | 285/87 |
| 4,242,533 | 12/1980 | Cott | 174/60 |

FOREIGN PATENT DOCUMENTS

| 214959 | 9/1924 | United Kingdom | 285/87 |

Primary Examiner—Dave W. Arola
Attorney, Agent, or Firm—Clifford A. Poff

[57] ABSTRACT

A lock for a cathodic test station apparatus includes interfitting thread segments at diametrically-opposite portions of a cover and on the outer surface of a test station collar used to support an upstanding terminal board for coupling test leads thereto. An L-shaped resilient lock is attached to the end wall of the collar. The resilient leg extends along the side wall adjacent the leading end of one thread segment.

8 Claims, 2 Drawing Figures

U.S. Patent May 3, 1983 4,382,155

LOCK FOR A TEST STATION APPARATUS

BACKGROUND OF THE INVENTION

This invention relates to an improved lock for a test station apparatus used to couple conductor leads extending from a pipe, a casing, an anode, the soil or the like to a device to measure, supply or respond to an electrical current or potential. More particularly, the present invention relates to a radially-extending L-shaped spring lock supported by a base collar so that a resilient leg overlies the outer side wall surface thereof and projects from the rim portion of a removable cover to permit access for disengagement from the end surface of a thread bar on the cover that is part of a clamping bayonet-type interconnection between the cover and the collar.

Cathodic test stations are typically employed to provide aboveground terminals for convenient monitoring of electrical currents and potentials associated with numerous types of piping, casing and other metallic structures. The test station provides terminals to which the leads are connected for measuring underground structure to soil potentials, cathodic protection anode currents, the resistive integrity of insulation between various types of underground structures such as a pipe, its casing or carrier. Such a test station is also used to direct and measure stray electrical currents in underground or subterranean structures as well as for reading electrical potentials.

One known form of test station apparatus provides a housing made of aluminum material attached to a metal conduit that offers no protection to personnel against electrical shocks and undergoes destructive corrosion. Measures, such as a lock, were not provided to deter or prevent unauthorized access to the terminals enclosed by the test station apparatus. A recent form of known test station apparatus is comprised essentially of plastic material and coupled to the upper end of a conduit or a carrier plate by a collet-type compression fitting. The test station apparatus includes a collar with pedestals to support a terminal block to traverse across an annular opening in the end wall of the collar. The side wall of the collar includes, in addition to a threaded portion for mating engagement with the threads of a collet nut, a separately threaded portion to mate with threads on a dome-like cover. Several different forms of lock structures have been suggested to prevent removal of the cover and unauthorized access to the terminals. One such lock takes the form of a lock bar on the cover that must be passed along a tortuous path of travel formed by projecting walls from the side wall of the collar. Another form of lock takes the form of a bayonet-type connection wherein one of the interlocking lock bars carries a resilient arm with a stop member to engage within a recess that is formed in the cover. A small hole in the cover is provided so that a rod-shaped instrument can be inserted through the hole to contact the stop member and displace it from within the recess. This form of lock is difficult to operate and requires the special use of a rod-shaped instrument. Since the resilient bar is made of plastic material and to provide the necessary strength to achieve the intended locking function, a very substantial force must be imposed by the instrument to move the lock projection from the recess in the cap. Moreover, the plastic material forming the lock member will yield or simply move from a locking relation in the recess of the cover by an excessively large torque applied to the cover. Unauthorized access to the test terminals could not be effectively prevented by these forms of locks.

SUMMARY OF THE INVENTION

It is an object of the present invention to provide a lock for a cathodic test station apparatus to effectively prohibit unauthorized access to test leads enclosed by a removable cap member through the operation of a lock spring member supported in a plane generally perpendicular to a resilient leg section that can be depressed.

It is a further object of the present invention to provide an improved lock for a test station apparatus to effectively prevent unauthorized access to test terminals normally enclosed by a removable cap while operation of the lock can be effective through prior knowledge of its operation without the use of a special tool, key or the like.

According to the present invention, there is provided a cathodic test station apparatus including the combination of a support member, a collar including a side wall to engage the support member, the collar including an end wall having an opening to pass test leads through the collar, at least one thread segment, preferably two diametrically-opposite thread segments on only a peripheral part of the side wall of the collar, terminal block means supported by the collar to traverse across the opening therein for coupling to test leads when extending through either segment of the opening, cover means including an an internal support seat engageable with the collar for enclosing the terminals, the cover means further including a rim portion having at least one, but preferably two, circumferential thread bars spaced from the support seat for clamping the thread segment on the collar therebetween through rotation of the cover means, the rim portion having at least one, but preferably two, discontinuous circumferential recesses between the terminal ends of each thread bar, the circumferential recess having a peripheral length at least equal to the length of a thread segment to pass the thread segment into the rim portion, and a generally L-shaped lock carried by the end wall of the collar with a radially-extending resilient leg overlying the outer surface of the side wall of the collar adjacent the leading end of the thread segment thereon, the resilient leg of the lock projecting from the rim portion of the cover for access to permit unlocked positioning thereof.

It is preferred to form a radially-extending recess in the end wall of the collar to receive and anchor the L-shaped lock. The end of the thread bar on the cap has an end wall face that extends radially with respect to the circular configuration of the cap for locking engagement with a side edge of the resilient leg of the lock. The lock is preferably comprised of a bent length of a spring steel strip. The resilient leg of the spring forms an approximately square face that can be depressed but having an adequate unyielding strength to prevent unauthorized rotation of the cap within a torque limit that can be reasonably imparted to the cap.

Figure 2:
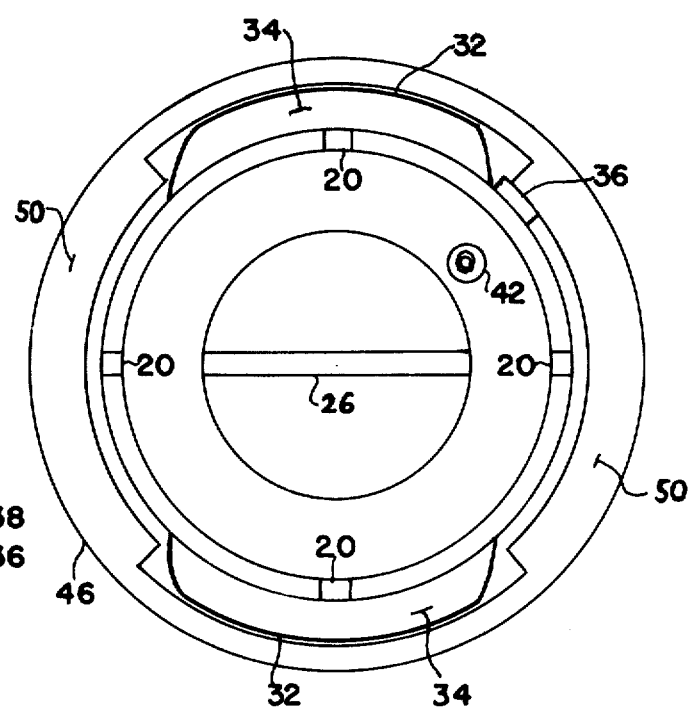

These features and advantages of the present invention as well as others will be more fully understood when the following description of the preferred embodiment of the present invention is read in light of the accompanying drawings, in which:

FIG. 1 is an exploded isometric view of a test station apparatus embodying the lock of the present invention; and FIG. 2 is an end plan view of the test station apparatus shown in FIG. 1.

In FIG. 1, a conduit 10 takes the form of a plastic pipe made from polyethylene for subterranean implantation to protectively house test leads passed through a suitable opening in the pipe and along the length thereof. An anchor of well known form is used on the implanted end portion of the pipe to retain the conduit at its implanted side. The conductor leads passed along the pipe 10 extend from a pipe casing, an anode, the soil or the like to terminal members supported aboveground in the apparatus of the present invention. The terminal members are normally enclosed by a protective cover which is removable to permit the measuring, supplying or responding to an electrical current or potential in the lead wires. Means may also be used to supply an anode current to the lead wires while protectively housed within the test station apparatus. In other installations, the test station apparatus may be supported by a carrier that is attached to an aboveground structure such as flange bolts or an insulating flange at wellheads. Electrical devices such as a variable resistor may be incorporated within the test station apparatus to adjust the control of cathodic protective current on a gathering line to the valve as required to properly protect the well casing.

The test station apparatus is preferably comprised of molded polycarbonate resin material which is available from the General Electric Company, sold under the trademark LEXAN, and Mobay Chemical Company, sold under the trademark MERLON. These polycarbonate materials have a dielectric strength of 380 volts per mil, dimensional stability within the range of $-100°$ F. to $+250°$ F., lightweight and stable under ultraviolet attack. The test station apparatus includes a collar 12 having an annular side wall 14 with a series of relatively fine threads 16 on the outer surface extending to the end of he collar which is opposite end wall 18. An opening 20 is located aat each of spaced peripheral locations to intersect the threads and form compressive arcuate segments by which the collar is clamped to the conduit 10 by means of a collet-type compression nut 22. Pedestals 24 project from diametrically-opposite sides of the end wall 18 and support a terminal plate 26 that is an integral part of the pedestals and collar. The terminal plate extends across an annular opening 28 such that opposed face surfaces of the terminal block overlie semicircular segments of the annular opening. This arrangement of parts enables free and unimpeded access to both sides of the terminal block whereby test leads in the conduit may be passed along either or both sides of the terminal block for coupling to terminals 30 which are shown in the form of bolts received in drilled openings in the terminal block. At each diametrically-opposite sides of the collar and forming planar extensions to the end wall are thread segments 32. While the top surface of each thread segment is substantially coplanar with the end wall of the collar, the opposite and lower surface 34 is inclined to form a thread surface. At the upwardly-inclined end of the thread surface 34 adjacent the terminal end thereof, there extends a resilient leg 36 of a lock bar 38. The lock bar preferably takes the form of a bent length of spring steel strip with the bent leg portion defining an approximately square face of one-half inch along a side which can be depressed. The remaining leg of the L-shaped lock is fitted into a recess 40 in the end wall where it is held in place by a fastener 42 comprised of a nut and bolt passed through a suitable opening in the fastener and end wall.

A dome-shaped cover 44 is used to protectively enclose the terminal block and leads coupled thereto but removable through the operation of the lock for access. The cover 44 includes an enlarged rim portion 46 on its lower end. The rim forms a seat surface 48 that is brought to rest on the top surface of end wall 18. Diametrically-opposed thread bars 50 have square end faces and between which they define discontinuous circumferential recesses, each having a length corresponding to the length of a thread bar 32. The outwardly-facing surface of the thread bars 50 essentially lie within a common plane while the oppositely-directed face forms an inclined thread surface 52 for mating engagement with one of the thread surfaces 34 of a thread segment 32.

As best shown in FIG. 2, the cover is placed on the collar and rotated such that the recesses 54 in the collar align with thread segments 32. The collar will then pass downwardly until seat surface 48 comes to rest on the end wall. When this occurs, the cover can be rotated in only one direction because of the inclined thread surface which, as one views FIG. 2, is in the clockwise direction. The inclined thread surfaces of the thread bar and thread segment come into mating engagement at the same time when the square end face of the thread bar is spaced beyond the trailing end of the resilient leg of the lock. When this occurs, the resilient leg moves outwardly into the recess between the thread bars. However, at this point in rotation, the mating face surfaces on the thread bar and thread segment contact each other under a sufficient force that continued rotation in the clockwise direction is impossible. Rotation of the cover in the counterclockwise direction is now impossible because the lock moves into obstructive contact with the end face of the thread bar. Only a relatively short terminal edge of the resilient leg of the lock is necessary for access through the gap between the rim portion of the cover and collet nut 22. A coin, screwdriver or any similar flat member can be inserted in this gap to depress the resilient leg against the side wall of the sleeve and thereby permit counterclockwise rotation and removal of the cover.

Although the invention has been shown in connection with a certain specific embodiment, it will be readily apparent to those skilled in the art that various changes in form and arrangement of parts may be made to suit requirements without departing from the spirit and scope of the invention.

We claim as our invention:

1. A cathodic test station apparatus for coupling conductor leads extending from a pipe, a casing, an anode, the soil or the like to a device to measure, supply or respond to an electrical current or potential, said apparatus including the combination of a support member, a collar including a side wall to engage said support member for support thereby, said collar including an end wall having an opening to pass test leads through the collar, at least one thread segment on only a peripheral part of the side wall of said collar, terminal block means including terminals supported by said collar to traverse across the opening therein for supporting test leads when extending through the opening, cover means, including an internal support seat engageable with said collar, for enclosing said terminals, said cover means further including a rim portion having at least one circumferential thread bar spaced from said support seat for urging said seat into clamping engagement with said collar when said thread segment and said thread bar are in engagement and are rotated relative to each other whereby said clamping engagement increases by continued rotation of said cover means until further rotation is impossible, said rim portion having at least one discontinuous circumferential recess between terminal ends of said thread bar, said circumferential recess having a peripheral length at least equal to the length of said thread segment for passage of said thread segment into said rim portion, and a generally L-shaped lock carried by said end wall with a radially extending resilient leg overlying the outer surface of the side wall of said collar adjacent the leading end of said thread segment thereon, said cover means and the rim portion thereof enclosing said L-shaped lock when threadedly engaged with a thread segment on said collar and said L-shaped lock lockingly engages a trailing end of said thread bar thereby preventing counterrotation, the resilient leg of said lock projecting from the rim portion of said cover for allowing access thereto so the depressing said resilient leg toward the side wall of said collar moves said resilient leg into an unlocked position whereby said thread bar can counterrotate past said resilient leg.

2. The apparatus according to claim 1 further including fastener means to join said L-shaped lock to the end wall of said collar.

3. The apparatus according to claim 1 or 2 wherein said end wall includes a radially-extending recess to receive and anchor said L-shaped lock.

4. The apparatus according to claim 1 wherein the rim portion of said cover means includes two circumferential thread bars, one at each of diametrically-opposite sides thereof, said circumferential recess being formed between one end of each thread bar, and wherein the side wall of said collar includes two thread segments, one at each of diametrically-opposite sides thereof.

5. The apparatus according to claim 1 wherein said collar includes threads on the side wall extending to the end thereof opposite said end wall, slotted openings at spaced peripheral locations intersecting said threads, said apparatus further including a nut member having a thread surface for mating engagement with said threads on said collar for attaching said support member thereto.

6. The apparatus according to claim 1 wherein said thread bar trailing end includes a radially-extending end wall face for said locking engagement with a side edge of the resilient leg of said lock.

7. The apparatus according to claim 1 or 6 wherein said lock comprises a bent length of a spring steel strip.

8. The apparatus according to claim 7 wherein the resilient leg of said lock defines an approximately square face which can be depressed.

* * * * *